United States Patent
Sutardja

(10) Patent No.: US 6,809,594 B2
(45) Date of Patent: Oct. 26, 2004

(54) ULTRA BROADBAND LOW NOISE AMPLIFIER WITH MATCHED REACTIVE INPUT IMPEDANCE

(75) Inventor: Sehat Sutardja, Los Altos Hills, CA (US)

(73) Assignee: Marvell International, Ltd., Hamilton (BM)

( * ) Notice: Subject to any disclaimer, the term of this patent is extended or adjusted under 35 U.S.C. 154(b) by 11 days.

(21) Appl. No.: 10/280,420

(22) Filed: Oct. 25, 2002

(65) Prior Publication Data

US 2004/0056722 A1 Mar. 25, 2004

Related U.S. Application Data

(60) Provisional application No. 60/413,595, filed on Sep. 24, 2002.

(51) Int. Cl.[7] .................................................. H03F 1/34
(52) U.S. Cl. ....................... 330/294; 330/295; 330/302; 330/305; 330/124 R
(58) Field of Search ................................ 330/294, 295, 330/302, 305, 124 R

(56) References Cited

U.S. PATENT DOCUMENTS 6,285,257 B1   9/2001   Abe et al. .................... 330/294
2002/0047747 A1   4/2002   Mulder

FOREIGN PATENT DOCUMENTS

WO   WO 02/13374   2/2002

OTHER PUBLICATIONS

U.S. patent application Ser. No. 10/072,843, filed Feb. 6, 2002.

Primary Examiner—Michael B. Shingleton

(57) ABSTRACT

A low noise amplifier (LNA) for amplifying an input signal communicated over a transmission line having an impedance. The LNA includes a current sensing amplifier having an input to connect to the transmission line. The current sensing amplifier has an input impedance that matches the transmission line impedance. The current sensing amplifier amplifies the input signal to generate a first output signal. A voltage sensing amplifier receives the input signal and generates a second output signal. A combiner combines the first output signal and the second output signal to generate an LNA output signal.

26 Claims, 2 Drawing Sheets

ULTRA BROADBAND LOW NOISE AMPLIFIER WITH MATCHED REACTIVE INPUT IMPEDANCE

CROSS-REFERENCE TO RELATED APPLICATIONS

This application claims the benefit of the filing date of U.S. provisional application No. 60/413,595 filed Sep. 24, 2002, the content of which is herein incorporated by reference in its entirety and the content of U.S. non-provisional application No. 10/072,843 filed Feb. 6, 2002, is herein incorporated by reference in its entirety.

TECHNICAL FIELD

An aspect of this invention relates to low noise amplifiers (LNAs).

BACKGROUND

Today, storage devices, such as hard disk drives, are operating at close to Gigabit/s data rates, and soon will reach 2 Gigabit/s data rates. At these data rates, signal bandwidth may approach Gigahertz levels; similar to wireless applications. As such, it is now important to utilize low noise amplifier circuitry having matched input impedance to achieve a flat frequency response when interfacing the amplifier circuitry to a storage device read head through a transmission line. This is similar to wireless applications, where a matched impedance low noise amplifier is generally needed to interface to the antenna and the corresponding transmission line attached to it.

However, unlike wireless applications, storage devices are more broadband in nature. In fact, most storage devices such as a hard disk drives produce signals from about DC to the Nyquist frequency. In contrast, wireless devices typically operate over a narrow frequency band (at most up to a few tens of Megahertz) with the signals centered around the carrier frequency. For the purpose of matching the input impedance of a conventional RF wireless amplifier, the impedance only needs to be matched at the carrier frequency. Input impedance matching of conventional wireless amplifiers can simply be achieved using resonance tuning with inductive and capacitive components as is well known to those skilled in the art.

Tuning schemes do not work on ultra broadband signals such as that found in a disk drive device and the emerging ultra wideband wireless devices that are being debated in the industry. For these ultra broadband and ultra wideband devices to work better, a very low noise amplifier is needed to process the weak signals encountered by the read head or the antenna. Since a transmission line is normally used to couple the read head or the antenna to the low noise amplifier, input impedance matching is needed.

Conventional very low noise amplifiers and other wideband amplifiers generally include a passive resistor to impedance match to the transmission line. However, using a passive resistor may increase power loss and the input noise figure (sometimes referred to as input referred noise voltage) due to the fundamental noise generated by the resistor. Circuit textbooks universally teach that any resistive components, real resistors or synthesized resistors, generate wideband thermal noise. The value of the fundamental noise is widely known to be $\sqrt{4kTR}$ for ideal resistors and somewhat higher for synthesized resistors.

SUMMARY

A low noise amplifier (LNA) for amplifying an input signal communicated over a transmission line having an impedance. The LNA includes a current sensing amplifier having an input to connect to the transmission line. The current sensing amplifier has an input impedance that matches the transmission line impedance. The current sensing amplifier amplifies the input signal to generate a first output signal. A voltage sensing amplifier receives the input signal and generates a second output signal. A combiner combines the first output signal and the second output signal to generate an LNA output signal.

The details of one or more embodiments of the invention are set forth in the accompanying drawings and the description below. Other features, objects, and advantages of the invention will be apparent from the description and drawings, and from the claims.

DESCRIPTION OF DRAWINGS

Like reference symbols in the various drawings indicate like elements.

DETAILED DESCRIPTION

Figure 1:
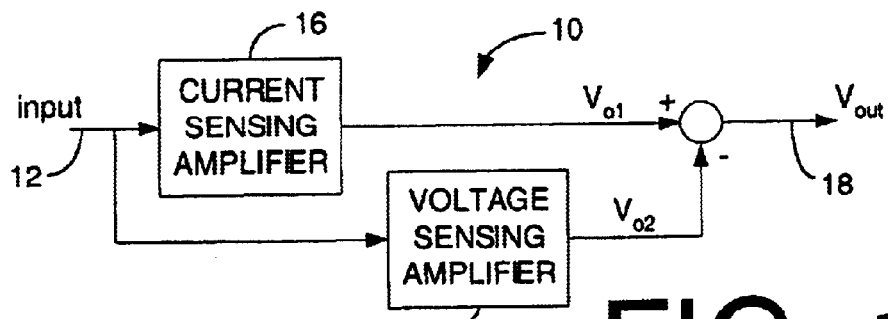
FIG. 1 is a block diagram of an aspect of an LNA.

FIG. 1 shows a low noise amplifier (LNA) 10 for amplifying an ultra broadband input signal 12 communicated to the LNA 10 over a transmission line (not shown). The LNA 10 may be fabricated using any suitable process including Metal Oxide Semiconductor (MOS) and Galium Arsenide (GaAs) or any other compound semiconductor devices. The LNA 10 includes a voltage sensing amplifier 14 and a current sensing amplifier 16 to amplify the input signal 12. The current sensing amplifier 16 may synthesize the input matching impedance for matching the impedance of the transmission line. The outputs of the voltage and current sensing amplifiers 14 and 16 are combined to generate the output signal, Vout, 18. The voltage and current sensing amplifiers 14 and 16 advantageously generate opposite and equal noise levels so that the noise generated by the input matching circuit substantially cancels out.

Figure 2:
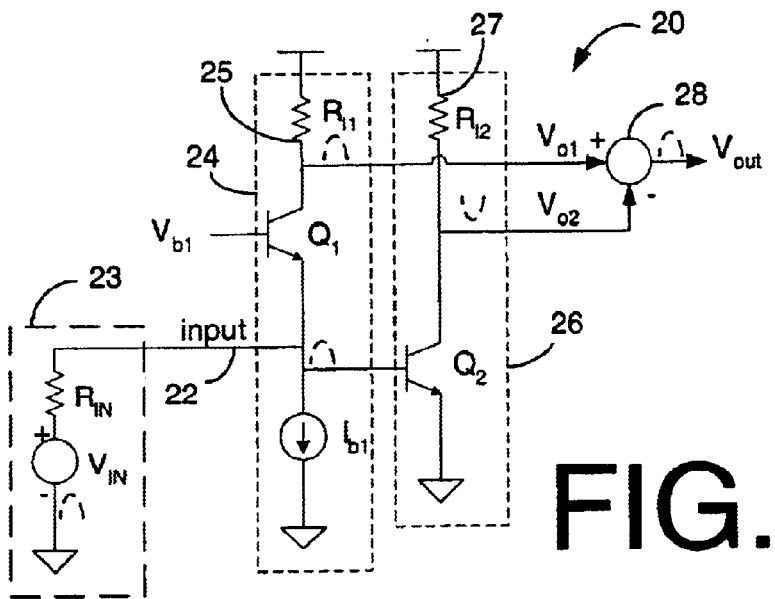
FIG. 2 is a detailed diagram of an aspect of an LNA.

FIG. 2 shows an aspect of an LNA 20 for amplifying an ultra broadband input signal 22. The input signal 22 may be generated by an input source 23. The LNA 20 includes a current sensing amplifier 24 for synthesizing the input matching impedance. In one aspect, the current sensing amplifier 24 may be configured as a common-base amplifier with current sink Ib1. Here, the transconductance, Gm, of the current sensing amplifier 24 equals $V_T/I_{b1}$, where $V_T$ stands for the volt equivalent of temperature (kT/q where k is the Boltzman constant, T is absolute temperature, and q is coulomb charge). In a typical application, an impedance value of 50 Ohms may be used. The 50 Ohms input impedance may be obtained by biasing the current sensing amplifier such that the transconductance, Gm, is equal to the inverse of 50 Ohms (20 milliMhos).

Although the current sensing amplifier 24 provides an input matching impedance to match the transmission line, half of the input signal may be lost. This is evident by looking at the voltage present on the input of the current sensing amplifier 24. In this case, the voltage is exactly half of the source value.

A voltage sensing amplifier 26 may recover the other half of the input signal. An input of the voltage sensing amplifier 26 may be connected to the input of the current sensing amplifier 24. The outputs of the current and voltage sensing amplifiers 24 and 26 may be combined in a summer 28. By combining the outputs of the current and voltage sensing amplifiers 24 and 26, full signal amplification may be achieved. In addition, the noise generated by the current sensing amplifier may be exactly cancelled out by summing the voltage sensing amplifier 26. In one aspect, the voltage sensing amplifier 26 may be configured as an emitter-follower amplifier. The current and voltage sensing amplifiers 24 and 26 may each include resistive loads 25 and 27. The ratio of the load resistors 25 and 27 may determine the values of k1 and k2 associated with the current and voltage sensing amplifiers 24 and 26.

AC coupling of the input signal may also be used to bias the operating point of the current sensing and voltage sensing amplifiers 24 and 26.

Figure 3:
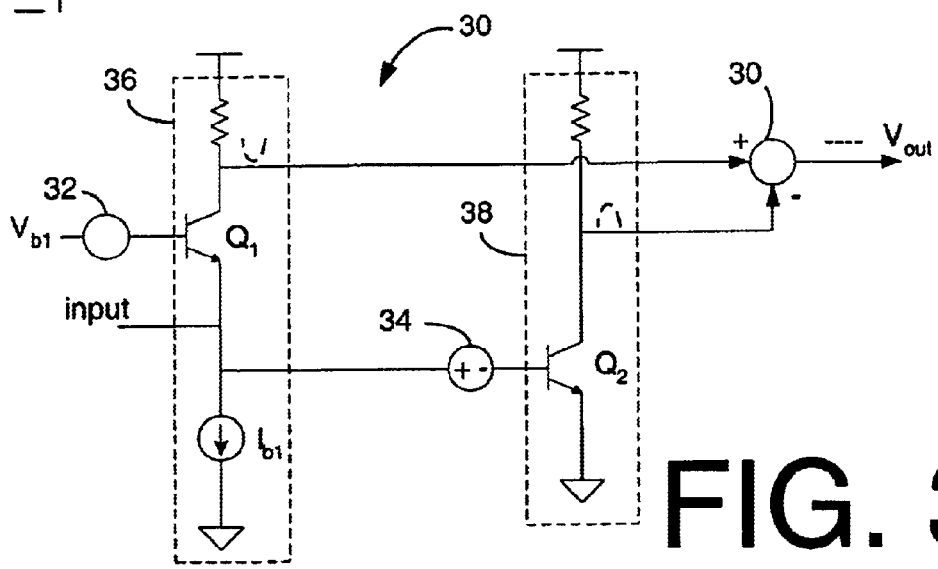
FIG. 3 is a detailed diagram of an aspect of an LNA including models of noise source.

FIG. 3 shows how an LNA 30 may cancel out the noise. Here, transistor equivalent noise sources have been added to the aspect of the LNA shown in FIG. 2. For simplicity, two noise sources 32 and 34 may be added, one noise source, v1, 32 at the input of the current sensing amplifier 36 and the other noise source, v2, at the input of the voltage sensing amplifier 38. Noise generated by other circuitry (input referred noise) is lumped into the noise sources 32 and 34 for each of the amplifiers 36 and 38.

The polarity of the amplified noise at the output of the two amplifiers may be traced as follows. In the current sensing amplifier 36, the output noise is equal to $-k1*v1$ where $k1$ is the gain of the current sensing amplifier 36. This number is a negative number since signal inversion occurs from the base of the amplifier 36 to the collector of the amplifier 36.

In the voltage sensing amplifier 38, the output noise contributed by the noise generated by the current sensing amplifier 36 is equal to $-\frac{1}{2}$ of $v1*k2$, where $k2$ is the gain of the voltage sensing amplifier 38. The factor of ½ is introduced because by the time the noise from the current sensing amplifier 36 reaches the emitter of the current sensing amplifier 36, half of the noise is lost due to the input impedance seen at the source of the signal which is substantially equal to the transconductance of the current sense amplifier 36. In other words, when the load seen by an emitter follower is equal to the Gm of an emitter follower, the gain of the emitter follower is ½.

The other contribution of the noise of the voltage sensing amplifier 38 is $-k2*v2$. After subtracting the output voltage of the amplifiers 36 and 38, and scaling k1 and k2 appropriately, the noise generated by v2 is left.

Meanwhile, the input signal is amplified by the amplifiers 36 and 38. The output voltage of the current sensing amplifier 36 due to the input signal is $\frac{1}{2} k1*vin$. There is no inversion because there is no inversion of signal communicated from the emitter to the collector of the current sensing amplifier 36. On the other hand, the output voltage of the voltage sensing amplifier 38 due to the input signal is $-\frac{1}{2}*k2*vin$. Note that there is an inversion of the input signal in the case of the voltage sensing amplifier 38.

By subtracting the output signals from the current and voltage sensing amplifiers 36 and 38, the components of the output signals associated with the input signal add together, while the components of the output signals related to noise source v1 32 substantially cancel out.

Noise source v2 remains as substantially the only source of noise components present in the output signal. Since noise source v2 represents noise generated by a voltage sensing amplifier, the noise can be made arbitrarily small. This may be done by making the Gm of the voltage sensing amplifier 38 very large. Note that this is not possible with a current sensing amplifier, since the input matched impedance dictates the Gm of the current sensing amplifier 36.

Figure 4:
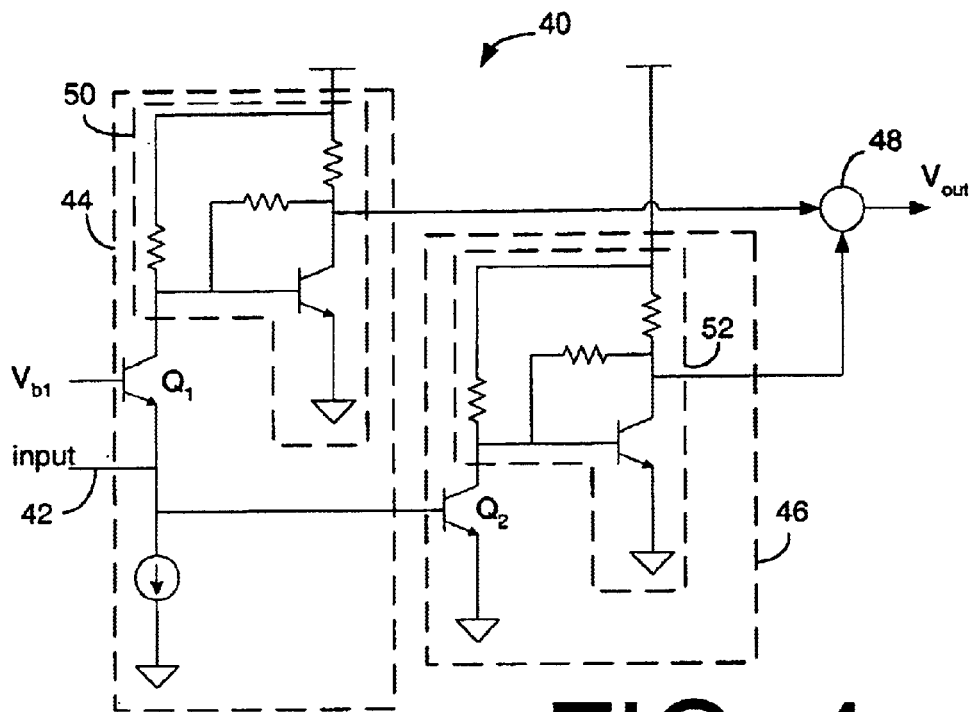
FIG. 4 is a detailed diagram of an aspect of an LNA.
Figure 5A:
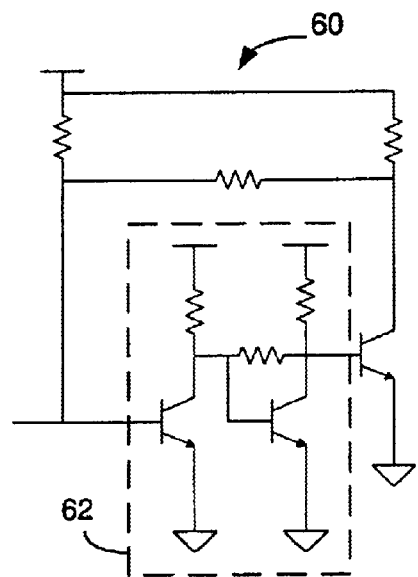
FIGS. 5A and 5B are detailed diagrams of aspects of amplifier loads for an LNA.
Figure 5B:
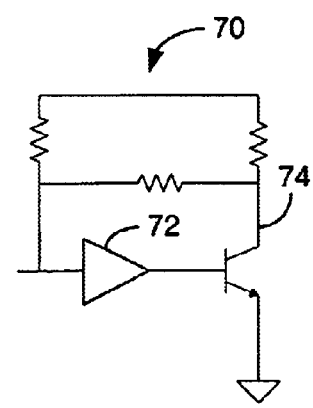

FIG. 4 shows another aspect of an LNA 40 for amplifying an ultra broadband input signal 22. The LNA 40 is similar in function to the LNA 20 with corresponding elements numbered from 22–28, except that in LNA 40 the resistive loads of the current sensing amplifier 44 and voltage sensing amplifier 46 may be replaced with transimpedance amplifiers 50 and 52. This may result in a significant increase in the achievable bandwidth. Alternatively, referring to FIG. 5A, a nested transimpedance amplifier structure 60 may be used as disclosed in pending U.S. non-provisional patent No. 10/072843, filed Feb. 6, 2001, which is hereby incorporated by reference in its entirety. Also, referring to FIG. 5B, a low gain amplifier 72 may be inserted in the transimpedance load 70 to increase the Gm of a transimpedance device 74 while minimizing the input capacitance and resistance of the transimpedance load. A factor of two to four of improvement can easily be achieved with a corresponding increase in bandwidth. Other types of amplifier loads may also be employed including amplifier loads that are not broadband or semi-broadband in nature.

Input capacitance cancellation may also be included to improve input matching over a wider frequency band.

A number of embodiments of the invention have been described. Nevertheless, it will be understood that various modifications may be made without departing from the spirit and scope of the invention. Accordingly, other embodiments are within the scope of the following claims.

What is claimed is:

1. A low noise amplifier (LNA) for amplifying an input signal communicated over a transmission line having an impedance, comprising:

a current sensing amplifier having an input to connect to the transmission line, the current sensing amplifier to impedance match the transmission line impedance and amplify the input signal to generate a first output signal;

a voltage sensing amplifier to receive the input signal and to generate a second output signal; and a combiner to combine the first output signal and the second output signal to generate an LNA output signal.

2. The LNA of claim 1 wherein the current sensing amplifier includes a common-base amplifier and a load.

3. The LNA of claim 2 wherein the load of the current sensing amplifier is selected from a group consisting of resistors, transimpedance amplifiers, nested transimpedance amplifiers, and low-gain amplifier transimpedance amplifier combinations.

4. The LNA of claim 3 wherein the load may be fabricated with load devices selected from a group consisting of MOS devices, GaAs devices, and compound semiconductor devices.

5. The LNA of claim 1 wherein the voltage sensing amplifier includes an emitter-follower amplifier and a load.

6. The LNA of claim 5 wherein the load of the voltage sensing amplifier is selected from a group consisting of resistors, transimpedance amplifiers, nested transimpedance amplifiers, and low-gain amplifier transimpedance amplifier combinations.

7. The LNA of claim 6 wherein the load may be fabricated withtload devices selected from a group consisting of MOS devices, GaAs devices, and compound semiconductor devices.

8. The LNA of claim 1 wherein the combiner generates an LNA output signal from a difference of the first output signal and the second output signal.

9. A low noise amplifier (LNA) for amplifying an input signal communicated over a transmission line having an impedance, comprising:

first means for amplifying the input signal to impedance match the transmission line impedance and to generate a first output signal;

second means for amplifying to receive the input signal and to generate a second output signal; and means for combining the first output signal and the second output signal to generate an LNA output signal.

10. The LNA of claim 9 wherein the first amplifying means includes a common-base amplifier and a load.

11. The LNA of claim 10 wherein the load of the first amplifying means is selected from a group consisting of resistors, transimpedance amplifiers, nested transimpedance amplifiers, and low-gain amplifier transimpedance amplifier combinations.

12. The LNA of claim 11 wherein the load may be fabricated with load devices selected from a group consisting of MOS devices, GaAs devices, and compound semiconductor devices.

13. The LNA of claim 9 wherein the second amplifying means includes an emitter-follower amplifier and a load.

14. The LNA of claim 13 wherein the load of the second amplifying means is selected from a group consisting of resistors, transimpedance amplifiers, nested transimpedance amplifiers, and low-gain amplifier transimpedance amplifier combinations.

15. The LNA of claim 14 wherein the load may be fabricated with load devices selected from a group consisting of MOS devices, GaAs devices, and compound semiconductor devices.

16. The LNA of claim 9 wherein the combining means generates an LNA output signal from a difference of the first output signal and the second output signal.

17. A method of amplifying an input signal communicated over a transmission line having an impedance, comprising:

providing a current sensing amplifier having a transconductance;

selecting the transconductance of the current sensing amplifier to impedance match the transmission line impedance;

with the current sensing amplifier;
  a) receiving the input signal; and
  b) generating a first output signal that is an amplified representation of the input signal;

providing a voltage sensing amplifier;

with the voltage sensing amplifier;
  a) receiving the input signal; and
  b) generating a second output signal that is an amplified representation of the input signal; and combining the first output signal and the second output signal to generate an LNA output signal.

18. The method of claim 17 wherein combining includes subtracting one of the first output signal and the second output signal from the other of the first output signal and the second output signal.

19. The method of claim 17 wherein generating the first output signal includes amplifying the input signal with a common-base amplifier.

20. The method of claim 17 wherein generating the second output signal includes amplifying the input signal with an emitter-follower amplifier.

21. The LNA of claim 2 wherein the current sensing amplifier load comprises a transimpedance load including a low-gain amplifier.

22. The LNA of claim 5 wherein the voltage sensing amplifier load comprises a transimpedance load including a low-gain amplifier.

23. The LNA of claim 10 wherein the load of the first amplifying means comprises a transimpedance load including a low-gain amplifier.

24. The LNA of claim 13 wherein the load of the second amplifying means comprises a transimpedance load including a low-gain amplifier.

25. The method of claim 19 further comprising loading the common-base amplifier with a first transimpedance load.

26. The method of claim 20 further comprising loading the emitter-follower amplifier with a second transimpedance load.

* * * * *

UNITED STATES PATENT AND TRADEMARK OFFICE
CERTIFICATE OF CORRECTION

PATENT NO. : 6,809,594 B2  Page 1 of 1
APPLICATION NO. : 10/280420
DATED : October 26, 2004
INVENTOR(S) : Sehat Sutardja It is certified that error appears in the above-identified patent and that said Letters Patent is hereby corrected as shown below:

Column 1, Line 33:  Delete "a" after "as"
Claim 7, Line 61:   Delete "may be" and insert -- is --
Claim 7, Line 62:   Delete "withtload" and insert -- with load --
Claim 12, Line 19:  Delete "may be" and insert -- is --

Signed and Sealed this

Fourteenth Day of November, 2006

JON W. DUDAS
*Director of the United States Patent and Trademark Office*